United States Patent [19]

Geisler et al.

[11] Patent Number: 5,259,603
[45] Date of Patent: Nov. 9, 1993

[54] DEVICE FOR MOUNTING AND TRANSPORTING SUBSTRATES IN VACUUM APPARATUS

[75] Inventors: Michael Geisler, Wächtersbach; Michael Jung, Kahl am Main, both of Fed. Rep. of Germany

[73] Assignee: Leybold Aktiengesellschaft, Hanau, Fed. Rep. of Germany

[21] Appl. No.: 828,259

[22] Filed: Jan. 30, 1992

[30] Foreign Application Priority Data

Nov. 5, 1991 [DE] Fed. Rep. of Germany ....... 4136342

[51] Int. Cl.⁵ .............................................. B25B 1/20
[52] U.S. Cl. ....................................... 269/43; 269/45; 269/152
[58] Field of Search ................ 269/254 R, 43, 45, 77, 269/299, 152, 296

[56] References Cited

U.S. PATENT DOCUMENTS

| | | | |
|---|---|---|---|
| 2,475,721 | 7/1949 | Prime | 269/254 |
| 3,865,072 | 2/1975 | Kirkman | 118/4 |
| 4,074,422 | 2/1978 | Borjesson et al. | 269/43 |
| 4,948,108 | 8/1990 | Sullivan | 269/43 |

FOREIGN PATENT DOCUMENTS

| | | |
|---|---|---|
| 250064 | 12/1987 | European Pat. Off. |
| 255931 | 4/1988 | Fed. Rep. of Germany |
| 272480 | 10/1989 | Fed. Rep. of Germany |
| 3919611 | 12/1990 | Fed. Rep. of Germany |
| 4029905 | 3/1992 | Fed. Rep. of Germany |

Primary Examiner—Bruce M. Kisliuk
Assistant Examiner—Eileen P. Morgan
Attorney, Agent, or Firm—Felfe & Lynch

[57] ABSTRACT

Device for mounting thin, preferably flat substrates (11, 11', ...) and for the transport of these substrates (11, 11'. ...) in treatment apparatus, for example vacuum coating and etching apparatus, the device being formed by a frame (1), preferably in a rectangular shape, which is of such size that in the area surrounded by the frame (1) a support, e.g., a support formed of spoke-like round rods (6, 6', ...). can be inserted, and on this support fastening means for mounting the substrates (11, 11', ...) are provided, which hold the substrates (11, 11', ...) such that their substantially planar lateral surfaces run approximately parallel to the plane of the frame.

9 Claims, 3 Drawing Sheets

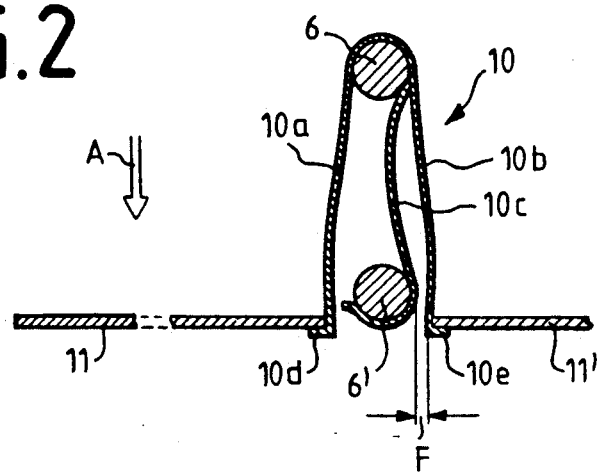
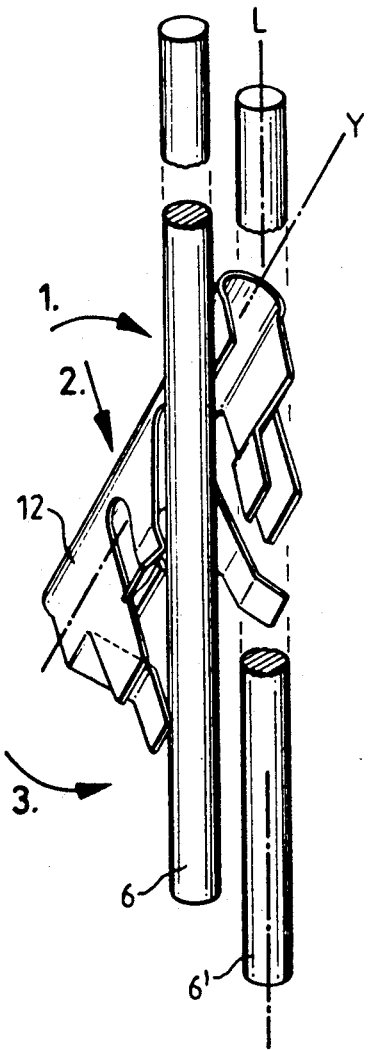
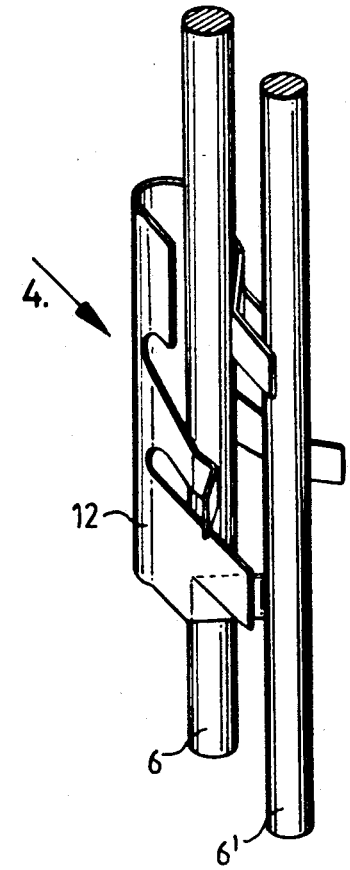
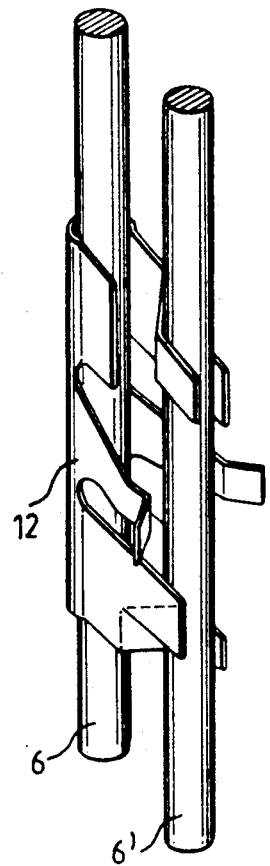

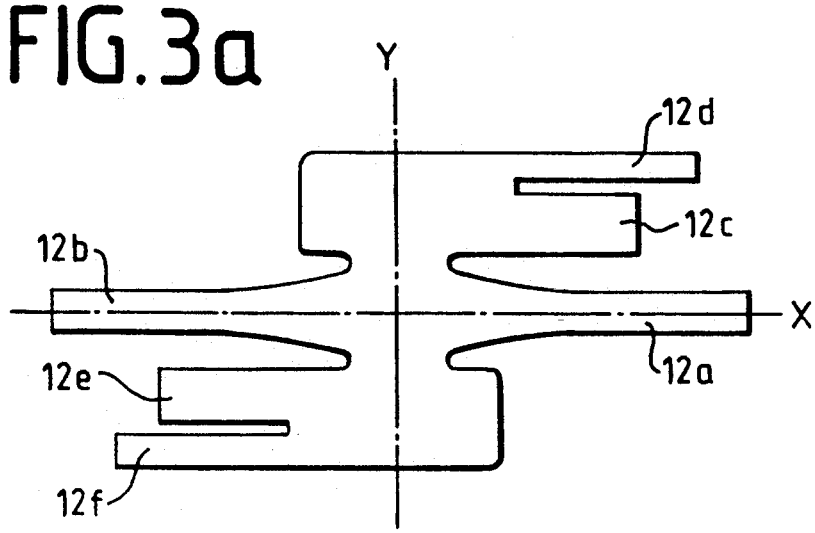
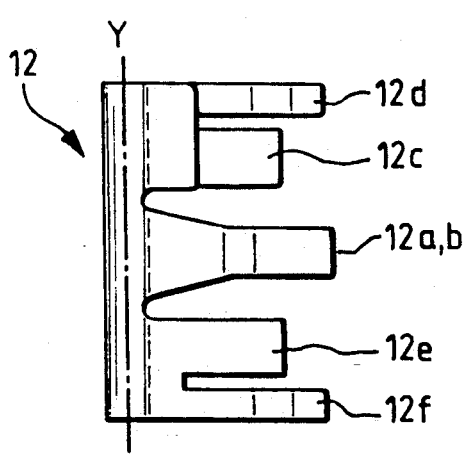
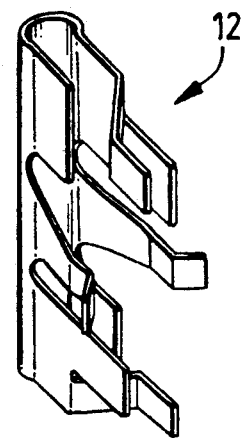
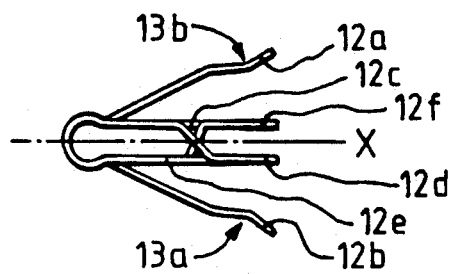

DEVICE FOR MOUNTING AND TRANSPORTING SUBSTRATES IN VACUUM APPARATUS

The invention relates to a device for the mounting of thin, preferably plate-like substrates and for the transport of these substrates in treatment apparatus, for example vacuum coating and etching apparatus.

Devices for the mounting and transport of substrates in vacuum apparatus, usually also called carriers, permit a plurality of substrates to be treated in a single operation. Carriers for thin, flat substrates, such as used in microelectronics, for example, have long consisted of a frame which is shaped according to the configuration of the apparatus, and a sheet-metal plate which is hung in the frame. The substrates to be treated are fastened to this plate by means of small hooks. There are also grid designs made of perforated sheet metal with tubes of rectangular cross section.

Carriers of the above-described kind can be used in processes and procedures in which only one side of the substrates is treated, as well as processes and procedures which do not require the substrates to be heated.

However, there are also vacuum processes which call for heating the substrates to, for example, 300° to 400° C.; maximum substrate temperatures up to 600° C. are achievable at the present time. For such processes it has proven to be disadvantageous that, due to the massive sheet-metal plates or grids made of tubular materials, on account of the great thermal capacity of the components, the danger of distortion of the plates and frame structures is very great. Even a slight distortion or bending of the mounting and transporting apparatus, however, appreciably interferes with the automated loading and unloading of the substrates.

Furthermore, in the case of grid designs, a great amount of space must disadvantageously be maintained between the substrates so as to avoid shadowing, e.g., by the casting of shadows, e.g., by infrared heaters, on the substrate. Calculations made for high uniformity of temperatures show, in the case of one particular substrate geometry, a minimum spacing of up to 30 mm between the edge of the substrate and the mounting frame.

Another disadvantage is to be seen in the great cost of the manufacture of the substrate holders of known design, as well as the amount of special low-distortion materials used. It is here that the invention provides relief. Its object is to create a mounting and transporting device of low mass and thus low thermal capacity and good resistance to temperature fluctuations, and thus to achieve a high dimensional accuracy during the heating procedure, in order to assure the automatic loading and unloading of the substrates. Furthermore, a maximum utilization of the carrier surface area is to be achieved for thin, flat substrates which can be heated on both sides during the vacuum process and can be coated on both sides, for example.

The invention achieves this object by the fact that the apparatus is formed by a frame, preferably of rectangular shape, which is of such dimensions that a support of spoke-like round rods is inserted into the area surrounded by the frame, that fastening means are provided on this support to hold the substrates, and that the substrates are held in such a manner that the front and back of the substrates are freely accessible.

The subject matter of the invention is a device of minimal mass made in a filigree-like manner and insensitive to distortion by heating, for the mounting and transport of the substrates, which comprises only a few, easily manufactured components. Thus, for example the thermal elongation of the round rods in the axial direction is taken up by compression springs, so that the entire system remains advantageously always flat and free of distortion, even in the case of the irregular irradiation of heat. The holding springs clipped onto the round rods are shaped so that dimensional tolerances of the substrates, the looseness in the movements of the loading and unloading system, and dimensional changes due to the heating of the substrates, are compensated.

Due to their low mass, both the round rods and the holding springs can be brought rapidly up to the process temperature and just as rapidly cooled down again. If an appropriate time of stay of the device equipped with substrates in the range of action of the heating system is selected, it is even possible to heat up the substrates so quickly that the massive frame is heated but slightly due to its high thermal capacity.

If a material of low thermal conductivity (e.g., CrNi steel) is used for the holding springs and the component cross section is minimized, no great amount of heat removal will take place at the contact surfaces between the holding spring and the substrate. The substrate is advantageously held in a virtually ideal isothermal manner.

Simultaneous treatment of the front and back of the substrate is easily possible.

Another advantage of the device according to the invention is that the substrates can be placed closely together in the direction of the length of their lateral surface, and that in the second direction perpendicular to the first a minimal spacing will result from the tolerance lengths of the substrates, the flexure of the holding springs, the positioning accuracy of the automatic loading and unloading system, the manufacturing tolerances of the device itself, and the wire gauge of the round rods. In one practical embodiment, therefore, a spacing of less than 10 mm from substrate to substrate would be realistic. Thus an optimum utilization of the carrier area is possible.

Due to an optimized design of the holding springs, the surfaces of the substrates are covered at the margin of the substrate by only tiny areas. These areas can be reduced, for example, to a fraction of a square millimeter in the case of substrate dimensions of 100×100 mm The invention admits of a great variety of embodiments; some of them are represented in the appended drawings, wherein:

FIG. 2 is a diagrammatic enlarged cross sectional view of a holding spring with two substrates held by it.

FIG. 3a is a plan view of preform of a preferred embodiment of a holding spring, on a larger scale.

FIG. 3b is a side view of a holding spring of FIG. 3a in final form.

FIG. 3c is a top view of the holding spring of FIG. 3b.

FIG. 3d is a perspective view of the holding spring of FIG. 3b, and

Figure 1:
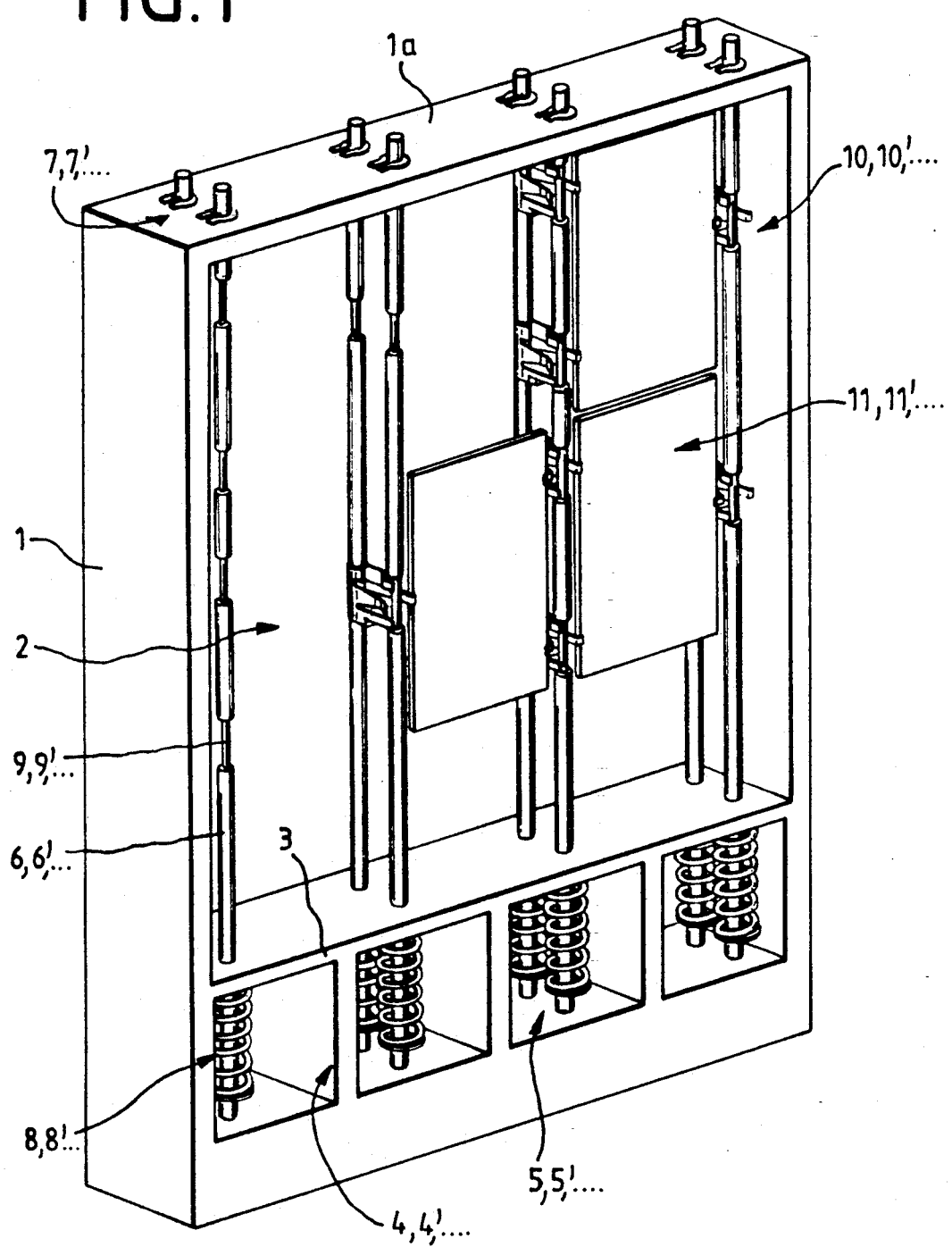
FIG. 1 is a perspective view of a substrate holder system with substrates inserted.

FIGS. 4a, b and c are perspective views, partly diagrammatic, show how the holding springs of FIG. 3 are inserted into a substrate carrier system in three steps.

The substrate carrier system in FIG. 1 comprises a frame 1 containing a rectangular interior space 2 in which a bulkhead 3 divides the interior 2 into a larger and a smaller part. The smaller part of the interior 2 is divided by additional bulkheads 4, 4′, . . . , into a plurality of rectangular openings 5, 5′, . . . , of equal size. In this frame 1 are inserted round rods 6, 6′, . . . , in pairs and parallel to the long sides of the frame 1. These rods are held at one end by retaining rings 7, 7′, . . . , on the outside of the end face 1a of the frame 1. The opposite ends of the rods 6, 6′, . . . , are brought through the bulkhead 3 and are biased by compression springs 8, 8′, . . . , which are in the openings 5, 5′, . . . , and coil around the ends of the rods 6, 6′, . . . . The rods 6, 6′, . . . , are provided at certain intervals with indentations 9, 9′, . . . , into which mounting springs 10, 10′, . . . , are inserted. These mounting springs 10, 10′, . . . , are so designed that each one simultaneously clasps a pair of round rods 6, 6′, . . . , and thus the torques of the mounting springs 10, 10′, . . . , are absorbed by the rods 6, 6′, . . . .

The substrates to be treated, 11, 11′, . . . , have a flat rectangular shape and are gripped between the mounting springs 10, 10′, . . . , of two adjacent pairs of roads 6, 6′, . . . , three mounting springs 10, 10′, . . . , for example, holding one substrate 11, 11′, . . . .

A mounting spring 10 (FIG. 2) consists of two spring legs of equal length in mirror-image symmetry, which are joined at one end and passed round the outside of one round rod 6 of a pair of rods 6, 6′. A fastening leg 10c is joined to the spring legs 10, 10b, and is hooked onto the second round rod 6′.

At their other free end the spring legs 10a, 10b, are bent outwardly so that these hooks 10d, 10e, act as an abutment for the substrates 11, 11′, . . . , inserted in direction A. The insertion of the substrates 11, 11′, . . . , can be performed by means of an automated loading and unloading system not shown.

In order to keep the coating area of the substrates 11, 11′, that is covered by the mounting springs 10, 10′, as small as possible, the hooks 10d, 10e are also made as small as possible.

An alternative embodiment of the mounting springs of FIG. 2 is shown in FIGS. 3a, b, c and d.

FIG. 3a shows the shape of the one-piece preform of mounting spring 12 of flat sheet metal wherein two axes X and Y are perpendicular to one another. The spring clips 10, 10′, . . . , 12 are of a harder material than the round rods 6, 6′, . . . .

Two finger-like strips 12a, 12b, extend in the direction of axis X and are in mirror-image symmetry with the axis Y. Two additional strips 12c and 12d of different length and width are situated above strip 12a and parallel to the axis X. Below strip 12b and parallel to the axis X another two strips 12e, 12f, are provided, which are of the same shape and size as strips 12c, 12d. If an initially flat preform (FIG. 3a) is bent around the Y axis to form a mounting spring 12, all strips 12a, b, c, d and f will point in one direction and form a meandering outline, while on the opposite side a straight edge will be created. The middle portion of the mounting spring 12 is bent in a three-quarter circle about the Y-axis (FIG. 3c), the opening facing in the direction of the X-axis. The two strips 12a and 12b diverge each about 30 degrees from the X-axis and are provided at their free ends with an approximately S-shaped bend. The substrates 11, 11′, . . . , snap into the recesses 13a, 13b, formed by this bend, in accordance with FIGS. 1 and 2.

The strips 12c and 12e run parallel to the X-axis, while 12d and 12f are bent in a zig-zag.

The mounting spring 12 described in FIGS. 3b and 3c is shown in perspective in FIG. 3d.

To install a mounting spring 12 (FIG. 4a) onto a pair of round rods 6, 6′, of a substrate holder system according to FIG. 1, the spring 12 is swung in a first step with its Y axis against the longitudinal axis L of the rod 6, 6′, . . . . As the second step the spring 12 is pressed slightly against the round rod 6 and in the third step it is swung back until axes Y and L are again parallel.

In the fourth and final step (FIG. 4b) the mounting spring 12 is pressed onto both round rods 6 and 6′.

FIG. 4c shows the springs 12 in the finally installed state on the rods 6 and 6′, so that now the substrates can be inserted into the mounting springs 12, as previously shown in FIG. 2.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Device for mounting thin substrates having planar side surfaces and for the transport of these substrates in treatment apparatus, comprising:
   a frame having a plane bordered by the frame;
   a support of round rods which is insertable in an area enclosed by the frame
   means for retaining the rods at one end with respect to the frame;
   means for biasing the rods at another end with respect to the frame; and
   fastening means on this support for mounting the substrates and for holding the substrates such that their substantially planar side surfaces run approximately parallel to an outer planar face bounded by the frame.

2. Device according to claim 1, which includes on each said another end a cylindrical compression spring placed axially on each rod in order to permit an axial longitudinal equalization of the rods with respect to the frame.

3. Device according to claim 1, in which the round rods have indentations.

4. Device according to claim 3, in which the fastening means for mounting substrates are insertable into the indentations.

5. Device according to claim 1, in which the fastening means are in the form of two-legged spring clips.

6. Device according to claim 5, in which the spring clips are of a harder material than the round rods.

7. Device according to claim 5, which includes a hook on each spring clip as an abutment for the substrate.

8. Device according to claim 5, in which each spring clip has S-shaped indentations into which the substrates that are to be held are inserted.

9. Device according to claim 1, in which the fastening means are so disposed on the support that the substrates are adjacent one another and are adjacent the frame.

* * * * *